US008481953B2

(12) United States Patent
Christophersen et al.

(10) Patent No.: US 8,481,953 B2
(45) Date of Patent: Jul. 9, 2013

(54) METHODS AND SYSTEMS OF ISOLATING SEGMENTED RADIATION DETECTORS USING ALUMINA

(75) Inventors: Marc Christophersen, Berwyn Heights, MD (US); Bernard F. Phlips, Great Falls, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 17 days.

(21) Appl. No.: 13/408,852

(22) Filed: Feb. 29, 2012

(65) Prior Publication Data

US 2012/0161266 A1    Jun. 28, 2012

Related U.S. Application Data

(63) Continuation-in-part of application No. 12/195,594, filed on Aug. 21, 2008, now Pat. No. 8,372,578, and a continuation-in-part of application No. 12/581,469, filed on Oct. 19, 2009.

(60) Provisional application No. 61/447,752, filed on Mar. 1, 2011.

(51) Int. Cl.
*G01T 1/24* (2006.01)

(52) U.S. Cl.
USPC .................................................. 250/370.01

(58) Field of Classification Search
USPC ....................... 250/370.01–370.15; 378/98.8
See application file for complete search history.

(56) References Cited

U.S. PATENT DOCUMENTS

| 7,282,409 B2 | 10/2007 | Mouli |
| 7,968,959 B2 | 6/2011 | Christophersen et al. |
| 2009/0092934 A1 | 4/2009 | Christophersen et al. |

OTHER PUBLICATIONS

Feser et al., "Integrating silicon detector with segmentation for scanning transmission X-ray microscopy," 2006, Nuclear Instruments and Methods in Physics Research A, vol. 565, pp. 841-854.*
PCTUS2012027140, US, Christophersen et al.
PCTUS20011001794, US, Fadeyev et al.

(Continued)

*Primary Examiner* — Kiho Kim
(74) *Attorney, Agent, or Firm* — Amy L. Ressing; John L. Young

(57) ABSTRACT

Radiation detectors can be made of n-type or p-type silicon. All segmented detectors on p-type silicon and double-sided detectors on n-type silicon require an "inter-segment isolation" to separate the n-type strips from each other; an alumina layer for isolating the strip detectors is applied, and forms negative charges at the silicon interface with appropriate densities. When alumina dielectric is deposited on silicon, the negative interface charge acts like an effective p-stop or p-spray barrier because electrons are "pushed" away from the interface due to the negative interface charge.

20 Claims, 8 Drawing Sheets

OTHER PUBLICATIONS

Pierre Saint-Cast, et al., Very low surface recombination velocity on p-type c-Si by high-rate plasma-deposited aluminum oxide, Applied Physics Letters, Oct. 2009, pp. 151-502, vol. 95, American Institute of Physics.

Wan, Nanometer Alumina, 2008, p. 1, Wan Jing New Material Co,. Ltd.

Raychowdhury et al. Proceedings on International Conference on VLSI design, 2004, pp. 1063-9667/04, Modeling and Estimation of Leakage in Sub-90nm Devices, IEEE Computer Society.

Karnik et al., Characterization of Soft Errors Caused by Single Event Upsets in CMOS Processes, IEEE Transactions on Dependable and Secure Computing, Apr.-Jun. 2004, pp. 128, vol. 1, No. 2, IEEE Computer Society.

Simon M. Sze, Physics of Semiconductor Devices, 2nd edition, Sep. 1981, pp. 379-407, pp. x-xii, pp. 852-868 of 868 pages, John Wiley & Sons, Wiley-Interscience, New York, USA.

PCTUS2009061200, US, Christophersen et al.

PCTUS2009061198, US, Christophersen et al.

* cited by examiner

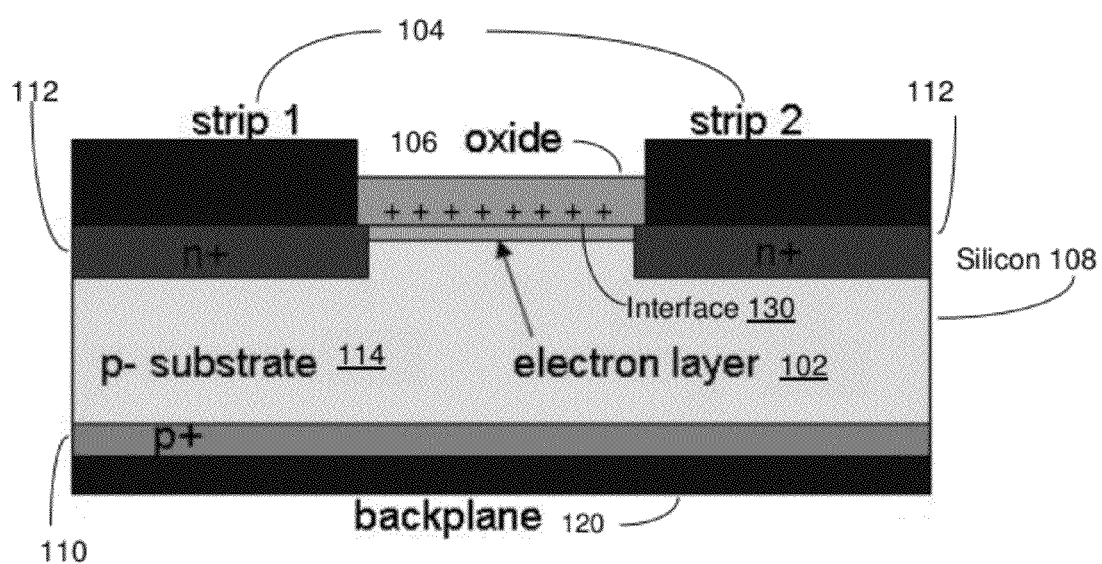
FIG. 1: Cross-section of a micro-strip n-on-p detector.

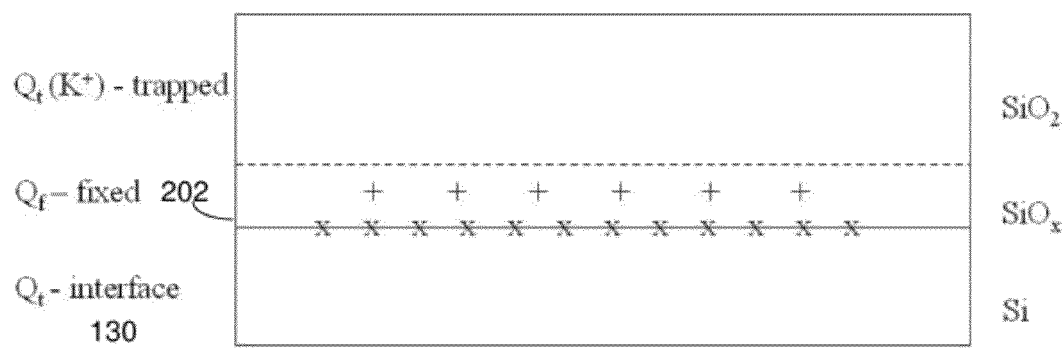
FIG. 2: Charges at the silicon/silicon oxide interface 130 (SiO$_x$ layer).

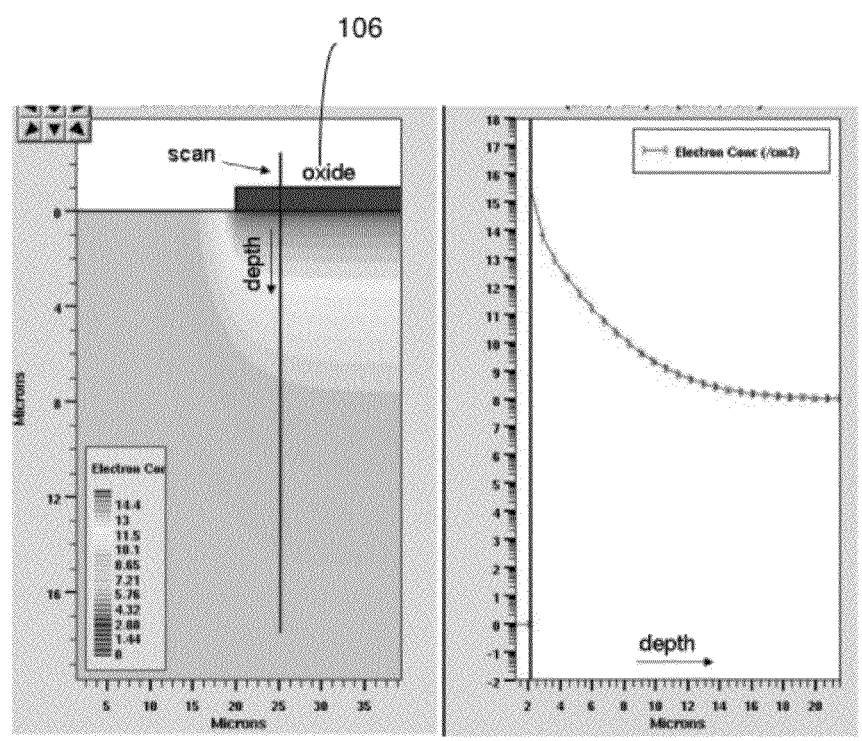
FIG. 3: FEM simulation of electron concentration underneath a silicon oxide layer (substrate high resistivity n-type Si).

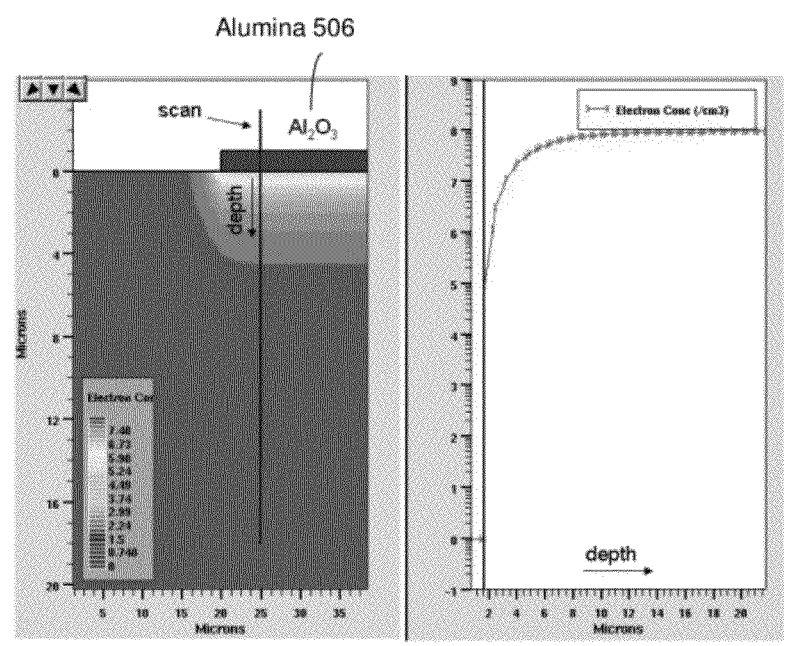
FIG. 5: FEM simulation of electron concentration underneath an alumina layer (substrate high resistivity n-type Si).

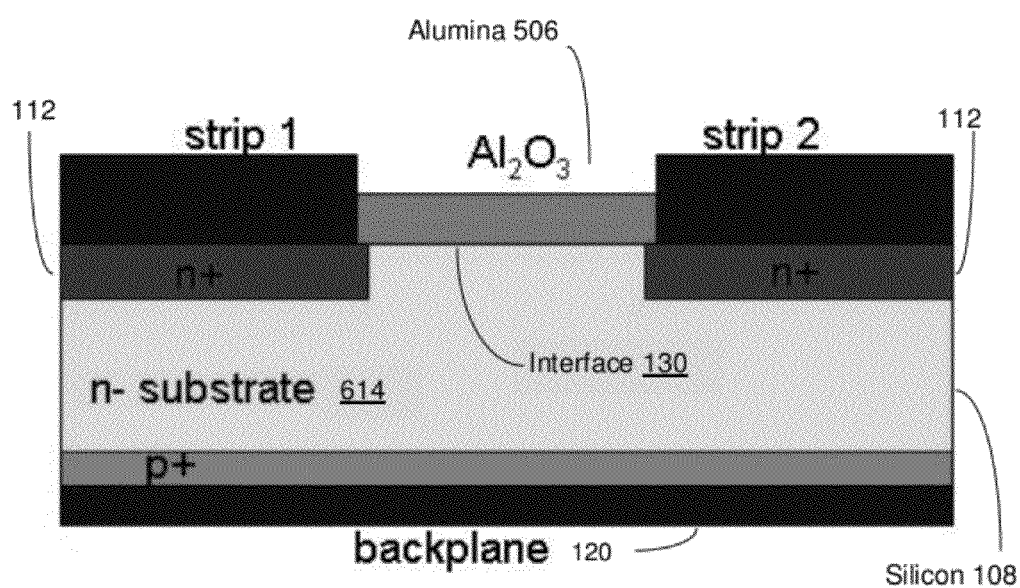
FIG. 6: Schematic of n-on-n strips with alumina.

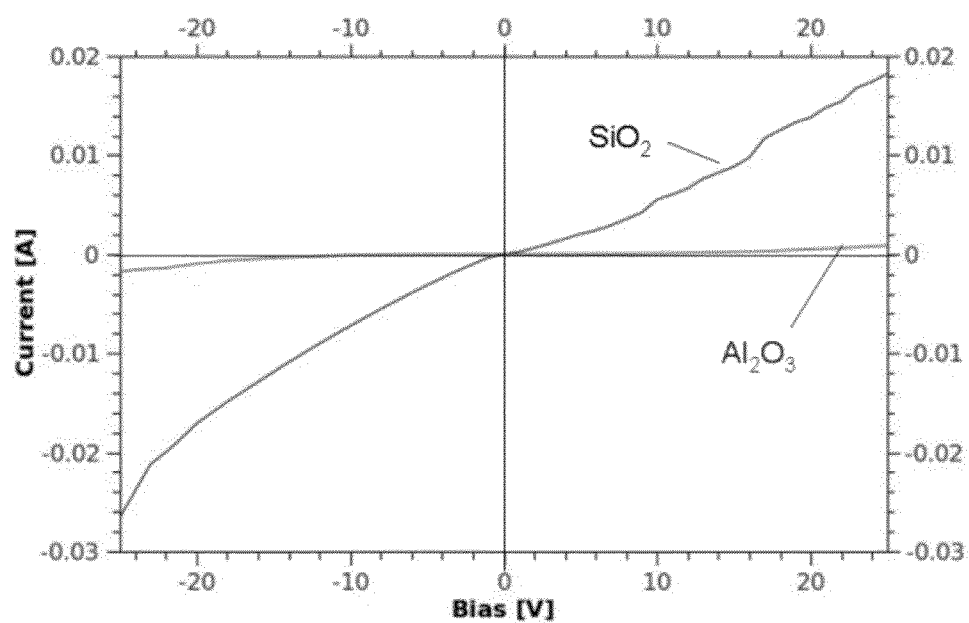
FIG. 8: Current (amps) vs. Bias Voltage (v) curves for strips with alumina ($Al_2O_3$ curve) and silicon oxide ($SiO_2$ curve) inter-strip passivation

US 8,481,953 B2

METHODS AND SYSTEMS OF ISOLATING SEGMENTED RADIATION DETECTORS USING ALUMINA

RELATED APPLICATIONS

The instant U.S. Patent Application claims the benefit of domestic priority from and is related to U.S. Provisional Patent Application No. 61/455,823, Method for Laser-Scribing of Semiconductor Devices with Improved Sidewall Passivation, filed on Oct. 27, 2010, which was the priority basis for pending U.S. Patent Cooperation Treaty (PCT) Application No. PCT/US2011/001794, filed on Oct. 21, 2011, whose inventors include Bernard F. Phlips, Marc Christophersen, Vitality Fadeyev, and Hartmut F.-W. Sadrozinski; and U.S. Provisional Patent Application No. 61/464,208, Method for Advanced Sidewall Passivation of Semiconductor Devices Using Alumina Layers, filed on Mar. 1, 2011, whose inventors include Bernard F. Phlips and Marc Christophersen, Vitality Fadeyev, and Hartmut F.-W. Sadrozinski; furthermore, this instant application is related to US PCT Application No. PCT/US12/27140, Isolating Segmented Radiation Detectors Using Alumina, filed on Mar. 1, 2012, whose inventors are Marc Christophersen and Bernard F. Phlips; and all of the above listed related cases are incorporated by reference herein each in their entirety.

Furthermore, the instant U.S. Patent Application is related to pending U.S. patent application Ser. No. 12/195,594, for Gray-Tone Lithography Using Optical Diffusers, filed on Aug. 21, 2008, formerly U.S. Provisional Application for Patent 60/978,514, whose inventors are Marc Christophersen and Bernard Phlips and said Application(s) are incorporated by reference herein in their entirety, (now U.S. Patent Application Publication No. US 2009/0092934). Further, the instant U.S. Patent Application is related to pending U.S. patent application Ser. No. 12/581,469, for Methods and Systems of Curved Radiation Detectors, filed on Oct. 19, 2009, whose inventors are Marc Christophersen and Bernard Phlips. Additionally, the instant U.S. Patent application is related to pending Patent Cooperation Treaty application PCT/US2009/061200, for Thick Silicon Drift Detector Fabrication, whose inventors are Marc Christophersen and Bernard Phlips; further, the instant U.S. Patent Application is related to pending Patent Cooperation Treaty application PCT/US2009/061198, for Curved Radiation Detector Fabrication Methods and Systems, whose inventors are Marc Christophersen and Bernard Phlips, where both pending PCT Applications designate the United States as the International Searching Authority; and both having been filed on Oct. 19, 2009 and are incorporated by reference herein in their entirety. Applicants claim the benefit of domestic priority and international priority of the above listed pending U.S. Patent Applications, U.S. Provisional Applications for Patent(s) and/or PCT Applications, respectively.

Finally, the instant application is related to U.S. Pat. No. 7,968,959, issued Jun. 28, 2011 for Methods and Systems of Thick Semiconductor Drift Detector Fabrication, whose inventors are Marc Christophersen and Bernard Phlips and the entire patent is herein incorporated by reference.

FIELD OF THE INVENTION

The present invention relates to segmented semiconductor radiation detector fabrication. More particularly, the present inventive fabrication process obtains radiation detectors at reduced costs by using fewer fabrication steps than conventional fabrication methods by circumventing the need for segment isolation. Position sensitive radiation detection is of great importance for multiple applications, ranging from Homeland Security detection instruments, medical imaging instruments to instrumentation used in high energy physics experiments.

BACKGROUND OF THE INVENTION

Modern radiation detectors are based on high-voltage semiconductor devices. The semiconductor substrates are commonly silicon, germanium, III-VI compound semiconductors, or II-VI compound semiconductors. Silicon is the most commonly used semiconductor. The basic operation is similar to a photo detector. The radiation hits the detector and generates charge carriers which are then collected on either a top or bottom surface of the device. In order to achieve good charge collection from the full depth of the detector, voltages up to several thousands volts are applied. For imaging applications, the radiation detectors need to be segmented. Pixel or strip detectors are the most common examples. Detectors that have strips on the front and back side are called double-sided strip detectors (DSSD). DSSDs and pixel arrays allow for full 2D positioning, depending on pixel and strip dimension, where position accuracy down to ~10-20 µm is possible.

Radiation detectors can be made of n-type or p-type silicon. Modern high energy physics experiments uses p-type silicon (Si) because p-type Si is more radiation hard in comparison to n-type Si. Strip detectors on p-type silicon require an "inter-strip isolation" to isolate them from each other. Between the strips a silicon oxide layer, such as Silicon Dioxide ($SiO_2$), is used as a dielectric. Since the Si—$SiO_2$ interface has a fixed positive charge, electrons from the bulk silicon can accumulate at the silicon surface and short neighboring strips to each other. In order to provide the necessary inter-strip isolation, "p-stops" are used. P-stops are junctions surrounding n-type strips, which avoid electron accumulation underneath the silicon oxide dielectrics. An alternative approach is the use of a "p-spray", where a blanket ion implantation is used to achieve the required inter-strip isolation. P-stops and p-sprays are implanted junctions, which require additional fabrication steps.

For n-type silicon detectors the situation is different. P-stops are needed for the n-on-n strips. N-on-n strips are most commonly used for double-sided-strip detectors.

The simplest type of semiconductor radiation detector involves observing the change in conductivity in a semiconductor due to the creation of additional charge carriers by an incident electromagnetic field or ionization created by a charged particle. These devices are commonly known as photoconductors. Semiconductor junction photodiodes can exhibit dramatically improved performance over simple photoconductor detectors. Photodiodes may be designed with improved response times, greater sensitivity, decreased thermal sensitivity, linearity over 9-10 orders of magnitude, large internal amplification, and may also be used to generate power at levels comparable to the power which can be generated by solar cells. The most common form of photodiode used is the silicon positive-intrinsic-negative (PIN) diode in which a thick layer of an intrinsic semiconductor material is grown between the p and n layers of the junction. The same structure can be made in germanium or any compound semiconductor. PIN diodes are normally fabricated using n-type silicon substrates with a bulk resistivity >1,000 Ωcm.

Referring to FIG. 1, positioning is accomplished by segmenting radiation detectors into radiation detector segment strips 104 or pixels on a silicon substrate or wafer, such as the p-substrate 114. One of the major technological challenges in the fabrication of n-in-p (n-type segment strips 104 in p-type Si) microstrip silicon detectors is to achieve a good isolation (i.e., separation) between the strips 104 (i.e., having good inter-strip isolation) at the n-side, while ensuring the satisfactory electrical performance of the devices during their life span. The inter-strip isolation is necessary, because the positive charge in the $SiO_2$ induces the creation of an electron accumulation layer 102 at the (oxide 106-silicon 108) interface 130, increasing the inter-strip capacitance and eventually shorting the strips 104 (such as strip 1, also identified as strip 104 and strip 2, also identified as strip 104) together, see FIG. 1.

FIG. 2 shows schematically the charges at the silicon/silicon oxide interface 130, where there is a non-stoichiometric $SiO_2$ layer, which has a positive charge labeled $Q_f$—fixed 202, according to S. M. Sze, Physics of Semiconductor Devices, Wiley-Interscience: $2^{nd}$ edition (September 1981). This positive charge attracts electrons.

FIG. 3 shows a finite element simulation (FEM) of the electron concentration distribution for an oxidized n-type silicon substrate (2,000 Ωcm), underneath a silicon oxide layer (substrate high resistivity n-type Si). The positive charge ($10^{11}$ cm$^{-2}$) leads to an electron accumulation at the silicon/silicon oxide interface 130 $Q_f$.

FIG. 4A, FIG. 4B, and FIG. 4C illustrate three different structures for inter-strip isolation. The p-spray 402 isolation technique consists of a medium dose p-implant which is applied to the entire n-side and is overcompensated by high dose $n^+$ pixel implants. The p-stop 404 is an implanted layer underneath the oxide. Since there will be an electron accumulation underneath the oxide, a high-field region develops at the edge of the p-stop 404. High-field regions are problematic because they can lead to catastrophic breakdowns during high voltage operation. The third type of inter-strip isolation is a combination of (p-spray/and p-stop) 406. This technique leads to a step in the effective p-spray 402 dose along the gap between two $n^+$-implants. In the middle of the gap, the normal p-spray 402 dose is reached. This guarantees the inter-pixel and/or inter-strip isolation. Near the edges, the p-spray dose is lower in order to minimize the electric field strength in these regions and to thereby improve breakdown performance, (i.e., see FIG. 4A, FIG. 4B, and FIG. 4C, which illustrate the p-spray 402, p-stop 404, and (p-stray/p-stop) 406, respectively. The high-field region depends on the design of the inter-strip isolation).

The inter-strip shorting due to electron accumulation is a problem for any segmented p-type and double-sided n-type detectors. The standard approach for inter-strip or interpixel isolation is the use of an implanted and annealed p-type layer.

P-stop or p-spray implants need to be annealed for implant action. This annealing step leads to an additional heat load for the sensor by a high temperature process step. Ideally, minimization of high temperature processes is more desirable in detector fabrication. Furthermore, any high temperature step increases the risk of introducing contamination.

Therefore, the need exists for a fabrication method of producing radiation detectors at reduced costs (preferably at a low temperature, <500° C.), using fewer fabrication steps than conventional fabrication methods (thus precluding the need for p-stop fabrication steps), while achieving segment isolation.

Further, the need exists for the replacement of silicon oxide with a dielectric which circumvents the problem of inter-strip shorting based on electron accumulation, due to the negative interface charge of the dielectric. Furthermore, atomic layer deposition is a low temperature process, reducing the overall thermal load.

SUMMARY OF THE INVENTION

A method and system are implemented in the fabrication of radiation detectors made from n-type or p-type silicon as herein disclosed. Strip detectors on p-type silicon require an "inter-strip isolation" to separate the strip 104 detectors from each other; repeated atomic layer deposition (ALD) of $Al_2O_3$ layers are used as dielectrics for isolating the strip 104 detectors, by forming negative charges at the silicon interface with appropriate densities. When the ALD $Al_2O_3$ layers are deposited on p-type Si, the negative interface charge acts like a p-stop 404 because electrons are "pushed" away from the interface, due to the negative interface charge. Properly treated $Al_2O_3$ layers can form negative charges at the silicon interface with densities of ~$10^{10}$-$10^{14}$ cm$^{-2}$, according to P. Saint-Cast, et al., Applied Physics Letters, 95, 151502 (2009).

BRIEF DESCRIPTION OF THE DRAWINGS

FIG. 1 illustrates a cross-section of a micro-strip n-on-p detector.

FIG. 2 illustrates schematically the charges at the silicon/silicon oxide interface 130 $Q_f$. There is a non-stoichiometric $SiO_2$ layer, which has a positive charge labeled $Q_f$—fixed 202. This positive charge attracts electrons.

FIG. 3 illustrates a finite element simulation (FEM) of the electron distribution for an oxidized n-type silicon substrate (2,000 Ωcm). The positive charge ($10^{11}$ cm$^{-2}$) leads to an electron accumulation at the silicon/silicon oxide interface 130, (i.e., a FEM simulation of electron concentration underneath a silicon oxide layer (substrate high resistivity n-type Si)).

FIG. 5 illustrates a FEM simulation of electron concentration underneath an alumina 506 ($Al_2O_3$) layer (substrate high resistivity n-type Si).

FIG. 6 illustrates a schematic of n-on-n strips with alumina 506.

FIG. 8 illustrates Current (amps) vs. Bias Voltage (v) curves for strips with alumina 506 ($Al_2O_3$ curve) and silicon oxide ($SiO_2$ curve) inter-strip passivation. The conductivity for the silicon oxide layer is much higher due to the electron layer underneath the oxide. This measurement is a simple proof of concept for the instant invention.

DETAILED DESCRIPTION OF THE INVENTION

Figures 4A, 4B, 4C:
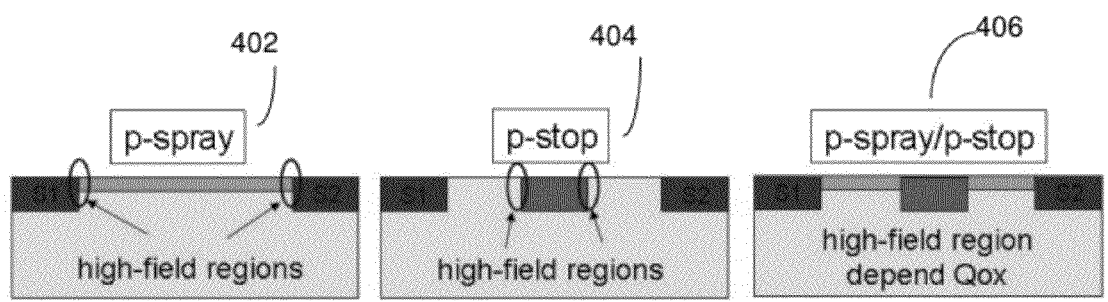
FIG. 4A, FIG. 4B, and FIG. 4C illustrate three different structures for inter-strip isolation, i.e., isolation of p-spray 402, isolation of p-stop 404, and isolation of combined (p-spray/p-stop) 406. The high-field region depends on the design of the inter-strip isolation.

Preferred exemplary embodiments of the present invention are now described with reference to the figures, in which like reference numerals are generally used to indicate identical or functionally similar elements. While specific details of the preferred exemplary embodiments are discussed, it should be understood that this is done for illustrative purposes only. A person skilled in the relevant art will recognize that other configurations and arrangements can be used without departing from the spirit and scope of the preferred exemplary embodiments. It will also be apparent to a person skilled in the relevant art that this invention can also be employed in other applications. Further, the terms "a", "an", "first", "second" and "third" etc. used herein do not denote limitations of quantity, but rather denote the presence of one or more of the referenced item(s).

In accordance with exemplary embodiments referring to FIG. 1 and FIG. 6, a method and system are implemented in the fabrication of segmented radiation detectors and/or pixel detectors made using n-type or p-type silicon as disclosed herein. Segmented radiation detector strips, such as strip 104 on p-type silicon require an "inter-strip isolation" to separate the strip 104 detectors from each other; an atomic layer deposition (ALD) of Alumina 506 ($Al_2O_3$) layers are used as dielectric stacks for isolating the strip 104 detectors, by forming negative charges at and/or between the silicon 108 interface 130 and strip 104 interfaces 112 with appropriate densities. When the ALD Alumina 506 ($Al_2O_3$) layers are deposited on p-type Si, the negative interface charge forms a barrier which acts as a comparable p-stop 404 barrier, because electrons (such as those associated with an electron layer 102, illustrated in FIG. 1) are "pushed" away from the interface 130 due to the negative interface charge. Properly treated Alumina 506 ($Al_2O_3$) layers can form negative charges at the silicon interface 130 with densities of ~$10^{10}$-$10^{14}$ $cm^{-2}$, according to P. Saint-Cast, et al., Applied Physics Letters, 95, 151502 (2009). FIG. 5 shows a finite element simulation (FEM) of the electron distribution for an alumina 506 layer n-type silicon substrate (2,000 Ωcm). Thus, it is important to note that the negative charge ($10^{11}$ $cm^{-2}$) "pushes" the electrons away from the interface 130, providing an effective p-stop 404 layer for inter-strip segment isolation.

Further according to exemplary embodiments, an n-type (n-on-n side) was used to demonstrate the effect of the alumina 506 as an effective comparable p-stop 404 barrier, FIG. 6 (also see FIG. 4B, which illustrates an actual physical p-stop barrier). The substrate 614 (as illustrated in FIG. 6) is a 20 kΩcm n-type 614 wafer. A homogeneous boron implant served as a homogenous back side contact (annealed at 950° C. for 1 h) [$p^+$ backplane 120 in FIG. 6]. On the front side simple single-side strip 104 detectors were formed. A thermal silicon oxide layer served as an implantation mask for phosphorous ions [$n^+$ backplane 120 in FIG. 6]. The implant was annealed in a RTP (rapid thermal processor) at 900° C. for 15 minutes.

After annealing the front side implant, the thermal silicon oxide was partially removed by a buffered oxide wet etch step. An ALD (atomic layer deposition) process is used for the Alumina 506 ($Al_2O_3$) deposition. ALD growth provides atomic layer control and conformal coatings on high aspect ratio structures. Since ALD deposition is conformal on high aspect ratio structures and is a low-temperature process, this ALD operation is a superior choice for sensor edge passivation. ALD is based on sequential, self-limiting surface chemical reactions. Alumina 506 ($Al_2O_3$) deposition is one of the oldest and well established ALD processes. The binary reaction for $Al_2O_3$ is:

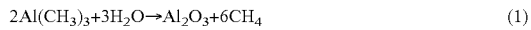

$$2Al(CH_3)_3 + 3H_2O \rightarrow Al_2O_3 + 6CH_4 \quad (1)$$

It can be split into the following surface half-reactions:

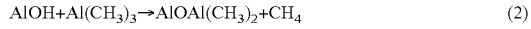

$$AlOH + Al(CH_3)_3 \rightarrow AlOAl(CH_3)_2 + CH_4 \quad (2)$$

$$AlCH_3 + H_2O \rightarrow AlOH + CH \quad (3)$$

The half reactions are repeated until an Alumina 506 ($Al_2O_3$) layer of the desired thickness is reached. Since all reactions can run at ≦300 C, this is a low-temperature process, which is harmless to the sensor, and adds only a very small thermal budget. An OpAL™ thermal and plasma atomic layer deposition system from Oxford Instruments is used. The OpAL™ allows thermal ALD and plasma-assisted ALD. (During plasma-assisted ALD a plasma source generates the reactive species for the surface reactions.) The deposition temperature is varied from 150 to 300 C. Thermal and plasma-assisted Alumina 506 ($Al_2O_3$) ALD are used. Thermally deposited alumina 506 layers lead to lower leakage currents. A thickness rate is obtained with 800 deposition cycles at 300° C., i.e., at a deposition rate of ~1.3 Angstrom/cycle.

After ALD deposition, Alumina 506 ($Al_2O_3$) oxide layers are removed from the open strip 104 areas. The alumina 506 is etched in a $CF_4$ plasma (15 mTorr, 25 sccm CF4, 75 W forward bias) [where, the torr is equal to the pressure required to raise a column of mercury 1 mm]. Leakage current is reduced by an annealing step, where, the alumina 506 layer is annealed for 10 minutes in an oven under nitrogen flow (pressure 1,500 mTorr). The etch mask is a standard AZ photoresist. After Reactive-Ion Etching (RIE etching) the sample is annealed at 390° C. for 10 minutes. The annealing step changes charge at the silicon Alumina 506 ($Al_2O_3$) interface 130 and repairs damage due to RIE etching.

Figures 7A, 7B:
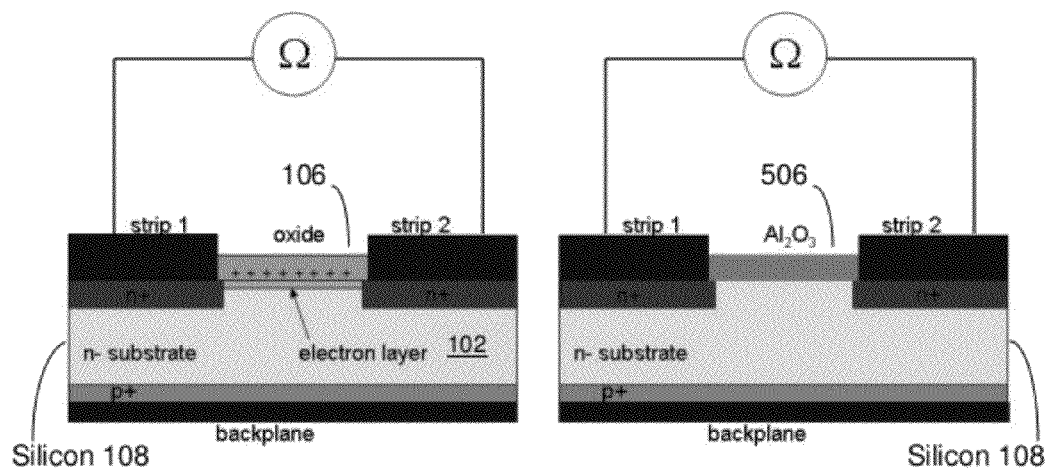
FIG. 7A illustrates Measurement of strip-to-strip conductivity for silicon oxide 106 (left), as an inter-strip dielectric.
FIG. 7B illustrates Measurement of strip-to-strip conductivity for alumina 506 (right) as an inter-strip dielectric.

The effect of the Alumina 506 ($Al_2O_3$) is tested with a standard probe station, where the strip-to-strip conductivity is measured, see FIG. 7B for a schematic of the conductivity measurement for Alumina 506.

FIG. 7A and FIG. 7B show measurements of strip-to-strip conductivity for silicon oxide 106 (FIG. 7A left) and Alumina 506 ($Al_2O_3$) (FIG. 7B right) as the inter-strip dielectrics.

FIG. 8 shows Current (amps) vs. Bias Voltage (v) curves for strips 104 with alumina 506 ($Al_2O_3$ curve) and silicon oxide 108 ($SiO_2$ curve) inter-strip passivation. The conductivity for the silicon oxide 108 layer is much higher due to the electron layer 102 underneath the oxide. This measurement is a simple proof of concept for the instant invention.

Position sensitive radiation detection is of great importance for multiple applications, ranging from Homeland Security, medical imaging to high energy physics experiment instrumentation. The inter-strip shorting due to electron accumulation is a problem for any segmented p-type and double-sided n-type detectors. The standard approach for inter-strip or interpixel isolation is an implanted and annealed p-type layer. The replacement of silicon oxide with alumina 506 circumvents the problem due to the negative interface charge of the dielectric. Furthermore, alumina 506 deposited by ALD deposition procedures is a low temperature process, reducing the overall thermal load. (Implant activation is done in a high temperature process.)

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The inventive method disclosed herein can be used for IC (integrated circuit) production, power electronics IC production, radiation hard electronic devices, radiation detector (or sensor) production, CCDs (charge-coupled device(s)), APS (active pixel sensor), and solar cell production.

Segmentation geometry: Pixel and strip 104 detectors are listed as segmented detectors. Any segmented detector needs inter-segment isolation. The technique disclosed herein works with any segment geometry.

Adjusted charge effect of dielectric: Since ALD is a layer-by-layer deposition technique, stoichiometry of the dielectric can be adjusted during film growth by changing the growth parameters (where precursor pulse time is one of the growth parameters). The interface charge changes with the stoichiometry.

Adjustment of charge by different surface terminations before ALD: Since the negative charge is an interface property, the first ALD cycles are critical for the charge formation. The efficiency and stoichiometry of the first ALD cycles depend on the surface termination of the silicon. A hydrogen termination, Si—H, will react differently from a fluorine terminated surface. Modifying the reaction efficiency of the ALD cycles can lead to different interface charge densities.

Other semiconductors: Alumina 506 layers are also used as inter-strip stops for other semiconductor materials. The technique disclosed herein is also used for Germanium, III-V and/or II-VI compound semiconductors.

Other dielectrics: An alumina 506 layer with a negative interface charge effect is disclosed herein. Other dielectrics with a negative interface charge have the same effect.

Alumina in combination with other dielectrics: Alumina can be used as one element of a stack for dielectrics or a nano-laminate, such as alumina combined with silicon oxides or nitrides layers. It is important that the overall interface of the stack has a negative interface charge.

Other ways of deposition for the alumina 506: The alumina 506 can be deposited by different means. Electron beam evaporated alumina 506 have shown negative interface charges with silicon.

Using the alumina 506 layer in combination with implanted segment isolation: For example, a classical p-stop 404 could be combined with an alumina 506 layer. The resulting structure would be similar to FIG. 4C, replacing the p-spray 402 with an alumina 506 layer as a surface layer. Combinations would allow modifying the high-field regions.

Radiation hard electronics: Radiation and ionizing particles can cause destructive and non-destructive changes in CMOS (complementary metal-oxide-semiconductor) devices. The standard approach to make a silicon based IC more radiation hard is to build design circuits having "radiation hardness by design". Referring to FIG. 6 and FIG. 1, the "enclosed layout transistor" is an example of such a design. Naturally occurring alpha particles, for example, generate electron hole pairs in several picoseconds. The charges generated in the depletion region or near the depletion region are separated by electric fields. The charges in the depletion region drift to the opposite polarity nodes in the first few picoseconds. On the other hand, the charges generated outside the depletion region diffuse slowly toward the collection nodes. Negative charge carriers can get trapped underneath the oxide-silicon interface 130 between the individual transistors. These trapped charges can cause noticeable leakage current between drain and source of neighboring transistors. Furthermore, according to F. Wan, et al., Proceedings on the International Conference on VLSI Design, 30 (2004), the collected carries can cause "soft-errors" in CMOS devices. The use of alumina 506 prevents the collection of negative charge carriers. Also, silicon oxide 106 and alumina 506 layers are used in combination to prevent positive and negative charge carrier build-up near transistors.

While the exemplary embodiments have been particularly shown and described with reference to preferred embodiments thereof, it will be understood by those skilled in the art that the preferred embodiments have been presented by way of example only, and not limitation; furthermore, various changes in form and details can be made therein without departing from the spirit and scope of the invention. Thus, the breadth and scope of the present exemplary embodiments should not be limited by any of the above described preferred exemplary embodiments, but should be defined only in accordance with the following claims and their equivalents. All references cited herein, including issued U.S. patents, or any other references, are each entirely incorporated by reference herein, including all data, tables, figures, and text presented in the cited references. Also, it is to be understood that the phraseology or terminology herein is for the purpose of description and not of limitation, such that the terminology or phraseology of the present specification is to be interpreted by the skilled artisan in light of the teachings and guidance presented herein, in combination with the knowledge of one of ordinary skill in the art. The description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein, as can be seen by the following claims:

What is claimed:

1. A method of fabricating a segmented radiation detector on a silicon substrate having inter-strip isolation, where the method comprises:
  forming n-type segments on a front side of the silicon substrate;
  separating the segmented radiation detectors from each other by depositing aluminum oxide layers on the silicon substrate, forming a silicon alumina interface
  pushing away electrons from the n-type segments by forming a negative interface charge barrier at the silicon alumina interface, wherein the negative interface charge barrier acts as an effective barrier, and wherein the negative interface charge barrier includes densities of approximately $10^{10}$-$10^{14}$ cm$^{-2}$; causing segment isolation.

2. The method of claim 1, wherein segments are strips.

3. The method of claim 1, wherein segments are pixels.

4. The method of claim 1, wherein alumina layers are deposited by atomic layer deposition.

5. The method of claim 1, wherein alumina oxide layers are part of a stack of dielectrics.

6. The method of claim 1, where the silicon substrate is p-type silicon.

7. The method of claim 1, where the silicon substrate is n-type.

8. The method of claim 7, where the silicon substrate has p-type strips on a back side.

9. A segmented radiation detector comprising:
  a plurality of n-type segments on a front side of a silicon wafer;
  a plurality of alumina oxide layers deposited on the front side of the silicon wafer, forming a dielectric isolation barrier having p-stop characteristics between the plurality of segments;
  the plurality of alumina oxide layers having a negative interface charge, wherein the plurality of alumina oxide layers have a negative interface charge density of approximately $10^{10}$-$10^{14}$ cm$^{-2}$.

10. The segmented radiation detector of claim 9, wherein the silicon substrate is a p-type wafer.

11. The segmented radiation detector of claim 9, wherein the silicon substrate is an n-type wafer.

12. The segmented radiation detector of claim 9, further comprising an alumina layer in combination with an implanted segmented isolation.

13. The segmented radiation detector of claim 9, wherein the n-type segments are strips.

14. The segmented radiation detector of claim 9, wherein the n-type segments are pixels.

15. The segmented radiation detector of claim 9, wherein the plurality of alumina oxide layers is deposited by atomic layer deposition.

16. The segmented radiation detector of claim 9, wherein the plurality of alumina oxide layers is part of a dielectric stack.

17. A method of fabricating a radiation hardened integrated circuit on a silicon substrate preventing the build up of electrons and holes, the method comprising:

forming a plurality of oxide segments on the silicon substrate, including an oxide silicon interface having a positive charge;

collecting holes underneath the plurality of oxide segments, forming a plurality of alumina segments on the silicon substrate, including a negative interface charge having densities of approximately $10^{10}$-$10^{14}$ cm$^{-2}$; causing segment isolation;

collecting electrons underneath the plurality of alumina segments of the radiation hardened integrated circuit.

18. The radiation hardened integrated circuit of claim 17, wherein the silicon substrate is a p-type wafer.

19. The radiation hardened integrated circuit of claim 17, wherein the silicon substrate is an n-type wafer.

20. The radiation hardened integrated circuit of claim 17, wherein the radiation hardened integrated circuit is an enclosed layout transistor.

* * * * *